(12) United States Patent
Park et al.

(10) Patent No.: US 10,006,146 B2
(45) Date of Patent: Jun. 26, 2018

(54) CLUSTER APPARATUS FOR TREATING SUBSTRATE

(71) Applicant: Kookje Electric Korea Co., Ltd., Chungcheongnam-do (KR)

(72) Inventors: Yong Sung Park, Chungcheongnam-do (KR); Sung Kwang Lee, Chungcheongnam-do (KR); Dong Yeul Kim, Chungcheongnam-do (KR); Ki Hoon Kim, Chungcheongnam-do (KR)

(73) Assignee: KOOKJE ELECTRIC KOREA CO., LTD., Chungcheongnam-Do (KR)

( * ) Notice: Subject to any disclaimer, the term of this patent is extended or adjusted under 35 U.S.C. 154(b) by 272 days.

(21) Appl. No.: 14/388,914

(22) PCT Filed: Mar. 26, 2013

(86) PCT No.: PCT/KR2013/002470
§ 371 (c)(1),
(2) Date: Sep. 29, 2014

(87) PCT Pub. No.: WO2013/147481
PCT Pub. Date: Oct. 3, 2013

(65) Prior Publication Data
US 2015/0059978 A1    Mar. 5, 2015

(30) Foreign Application Priority Data

Mar. 28, 2012  (KR) .................. 10-2012-0031623
Mar. 19, 2013  (KR) .................. 10-2013-0029343

(51) Int. Cl.
*C30B 25/14*    (2006.01)
*C23C 16/04*    (2006.01)
(Continued)

(52) U.S. Cl.
CPC .............. *C30B 25/14* (2013.01); *C23C 16/04* (2013.01); *C23C 16/45574* (2013.01);
(Continued)

(58) Field of Classification Search
USPC ........................................ 118/715; 156/345.1
See application file for complete search history.

(56) References Cited

U.S. PATENT DOCUMENTS 7,628,824 B2 * 12/2009 Machida ........... H01L 21/67161
                                                118/696
7,815,739 B2 * 10/2010 Matsuura .......... H01L 21/31116
                                                118/719

(Continued)

FOREIGN PATENT DOCUMENTS

CN    101165856 A    4/2008
CN    101812724 A    8/2010
(Continued)

OTHER PUBLICATIONS

International Search Report corresponding to PCT International Application No. PCT/KR2013/002470 dated Jul. 4, 2013.

*Primary Examiner* — Rudy Zervigon
(74) *Attorney, Agent, or Firm* — Carter, DeLuca, Farrell & Schmidt, LLP

(57) ABSTRACT

Provide an apparatus for selective epitaxial growth. The apparatus for selective epitaxial growth, the apparatus comprising, a process tube comprising an inner tube in which a substrate stack unit for receiving a plurality of substrates is accommodated and an outer tube surrounding the inner tube, a heater assembly disposed to surround the process tube and a side nozzle unit vertically disposed inside the process tube, wherein the side nozzle unit comprises first and second side nozzles for respectively spraying an etching gas and a depo gas for the selective epitaxial growth.

12 Claims, 11 Drawing Sheets

(51) Int. Cl.
  *C23C 16/455* (2006.01)
  *C23C 16/54* (2006.01)
  *C30B 25/10* (2006.01)
  *H01L 21/67* (2006.01)
  *H01L 21/677* (2006.01)
  *C30B 29/06* (2006.01)

(52) U.S. Cl.
  CPC ........ *C23C 16/45578* (2013.01); *C23C 16/54* (2013.01); *C30B 25/10* (2013.01); *H01L 21/67201* (2013.01); *H01L 21/67207* (2013.01); *H01L 21/67757* (2013.01); *C30B 29/06* (2013.01)

(56) References Cited

U.S. PATENT DOCUMENTS

| | | |
|---|---|---|
| 2003/0053893 A1 | 3/2003 | Matsunaga et al. |
| 2007/0134415 A1* | 6/2007 | Hwang ............ H01L 21/31654 427/248.1 |
| 2009/0087964 A1* | 4/2009 | Maeda ................. C23C 16/345 438/482 |
| 2010/0218724 A1* | 9/2010 | Okada ................. C23C 16/4405 118/724 |

FOREIGN PATENT DOCUMENTS

| | | |
|---|---|---|
| CN | 102330072 A | 1/2012 |
| JP | H03-016208 A | 1/1991 |
| JP | H04-006825 A | 1/1992 |
| JP | H04-163912 A | 6/1992 |
| JP | 2000-068214 A | 3/2000 |
| JP | 2003-077974 A | 3/2003 |
| JP | 2008-103642 A | 5/2008 |
| JP | 2008-124181 A | 5/2008 |
| JP | 2009-147373 A | 7/2009 |
| JP | 2010-226092 A | 10/2010 |
| KR | 2008-0054759 A | 6/2008 |
| KR | 2008-0071681 A | 8/2008 |
| KR | 2009-0006178 A | 1/2009 |
| KR | 20090118632 A | 11/2009 |
| KR | 10-0985723 B1 | 10/2010 |
| KR | 10-1015228 B1 | 2/2011 |
| KR | 10-1313262 B1 | 9/2013 |
| TW | 200802543 A | 1/2008 |
| TW | 201207904 A | 2/2012 |

* cited by examiner

CLUSTER APPARATUS FOR TREATING SUBSTRATE

TECHNICAL FIELD

The present invention relates to a selective epitaxial growth apparatus and cluster equipment for selectively growing an epitaxial film on a substrate.

BACKGROUND ART

Epitaxial growth is a process for growing a thin film having the same crystalline structure as a semiconductor substrate on the semiconductor substrate.

Also, a process in which an insulation layer such as an oxide layer and a nitride layer is formed on a predetermined area of the semiconductor substrate to expose the predetermined area of the semiconductor substrate, and a homogeneous or heterogeneous semiconductor film having the same crystalline structure as the semiconductor substrate is grown on only the exposed semiconductor substrate is called selective epitaxial growth (SEG). If the selective epitaxial growth is used, a semiconductor device having a three-dimensional structure, which is difficult to be manufactured by using the existing flat panel technology, may be easily manufactured. In a process including the SEG, gas supply and gas distribution on the substrate may be very important.

However, in the typical batch-type selective monocrystal growth device, since a reaction gas sprayed from a side nozzle flows onto upper and lower ends of an inner tube, where an exhaust passage is defined to cause a non-uniform reaction gas flow above the substrate, film uniformity after the film is formed may be deteriorated. Particularly, since a gap exists between the inside of the inner tube and an outer diameter of the substrate, most of the gas sprayed onto the substrate flows into the gap of a side surface of the substrate without sufficiently reacting on the substrate. Thus, it may take a relatively long time to form a film, and flatness in film quality may be reduced.

DISCLOSURE OF THE INVENTION

Technical Problem

Embodiments of the present invention provide a selective epitaxial growth apparatus and cluster equipment for uniformly forming a film on a substrate through selective epitaxial growth.

Embodiments of the present invention provide a selective epitaxial growth apparatus and cluster equipment, which are capable of providing a uniform gas flow on a substrate.

Embodiments of the present invention provide a selective epitaxial growth apparatus and cluster equipment, which are capable of increasing productivity.

The feature of the present invention is not limited to the aforesaid, but other features not described herein will be clearly understood by those skilled in the art from descriptions below.

Technical Solution

According to an aspect of the present invention, an apparatus for selective epitaxial growth includes: a process tube comprising an inner tube in which a substrate stack unit for receiving a plurality of substrates is accommodated and an outer tube surrounding the inner tube; a heater assembly disposed to surround the process tube; and a side nozzle unit vertically disposed inside the process tube, wherein the side nozzle unit includes first and second side nozzles for respectively spraying an etching gas and a depo gas for the selective epitaxial growth.

Also, the side nozzle unit may further include side curtain nozzles disposed in parallel to each other with the first side nozzle therebetween to spray an inert gas so as to improve straightness of a first process gas sprayed from the first side nozzle.

Also, the apparatus for selective epitaxial growth may further include a boat rotation unit rotating the substrate stack unit.

Also, the side nozzle unit may further include a pre-depo nozzle for precoating of the inside of the inner tube.

Also, the side nozzle unit may further include a lower cleaning nozzle for cleaning a lower end of the inner tube when the inside of the inner tube is cleaned.

Also, the lower cleaning nozzle may have a relatively short length when compared to that of each of other side nozzles.

Also, at least one of the first and second side nozzles may include section nozzles for spraying the gas for each of two or more sections in a longitudinal direction of the substrate stack unit.

Also, in the section nozzles, a section nozzle for a lower section of the substrate stack unit may have a double-tube structure so that gas staying times within the nozzles are the same.

Also, in the section nozzles, a confinement structure for restraining a gas flow may be disposed in a section nozzle for a lower section of the substrate stack unit so that gas staying times within the nozzles are the same.

Also, the inner tube may further include a cutoff part defined in a straight line with the first side nozzle in one side surface thereof.

Also, the cutoff part may have an inverted triangle shape of which a width gradually increases from a lower end thereof toward an upper end thereof, a triangle shape of which a width gradually decreases from the lower end thereof toward the upper end thereof, or a vertically asymmetric shape, Also, the cutoff part may have an individual hole shape facing each of spray holes of the first side nozzle.

Also, the apparatus for selective epitaxial growth may further include a control unit for controlling an operation of the boat rotation unit, wherein the control unit may control a rotation rate of the boat rotation unit according to a time for each supply stage of the gas supplied through the side nozzle unit.

According to another aspect of the present invention, cluster equipment for treating a substrate includes: an equipment front end module (EFEM) comprising load ports where cassettes in which substrates are stacked are placed; a first loadlock chamber connected to the EFEM through a gate valve and having an inner space that is selectively converted into an atmospheric or vacuum pressure; a transfer chamber in which a carrying device for carrying the substrate is disposed, the transfer chamber being connected to the first loadlock chamber through a gate valve; second loadlock chambers in which substrate stack units in which substrates are stacked in a batch type are disposed, the second loadlock chambers each of which is connected to the transfer chamber through a gate valve; and process chambers each of which is disposed on each of the second loadlock chambers, the process chambers for process-treating the substrates stacked on the substrate stack unit.

Also, the cluster equipment may further include side curtain nozzles disposed in parallel to each other with the first side nozzle therebetween to spray an inert gas so as to improve straightness of a first process gas sprayed from the first side nozzle.

Also, the cluster equipment may further include: a pre-depo nozzle vertically disposed inside the process tube to perform pre-coating on the inside of the inner tube; and a lower cleaning nozzle for cleaning a lower end of the inner tube when the inside of the inner tube is cleaned.

Also, the inner tube may further include an exhaust port disposed in a straight line with the first side nozzle.

Also, each of the transfer chamber, the second loadlock chamber, and the process chamber may be maintained in a vacuum state.

Also, the cluster equipment may further include a vacuum exhaust unit connected to each of the transfer chamber, the second loadlock chamber, and the process chamber.

Also, the EFEM may further include: an index chamber in which a carrying device disposed between the load ports and the first loadlock chamber to carry the substrate between the cassette disposed on the load port and the first loadlock chamber is disposed; and a dummy substrate storage module disposed on a side surface of the index chamber to store dummy substrates.

Also, the transfer chamber may further include a dummy substrate storage module.

Advantageous Effects

According to the embodiment of the present invention, the productivity may increase.

Also, according to the embodiment of the present invention, the substrate may be treated into the batch type within the cluster equipment to reduce an occupied area of the equipment under the same output.

According to the embodiment of the present invention, the film may be uniformly formed on the substrate in the selective epitaxial growth.

According to the embodiment of the present invention, the gas may uniformly flow on the substrate to improve the quality of the film formed on the substrate.

MODE FOR CARRYING OUT THE INVENTION

Hereinafter, an apparatus and cluster equipment for selective epitaxial growth according to an embodiment of the present invention will be described with reference to accompanying drawings. In description of the present invention, detailed descriptions related to well-known functions or configurations will be ruled out in order not to unnecessarily obscure subject matters of the present invention.

In the current embodiment, the substrate may be a semiconductor wafer. However, the present invention is not limited thereto, and for example, the substrate may be other types of substrates such as a glass substrate.

Figure 1:
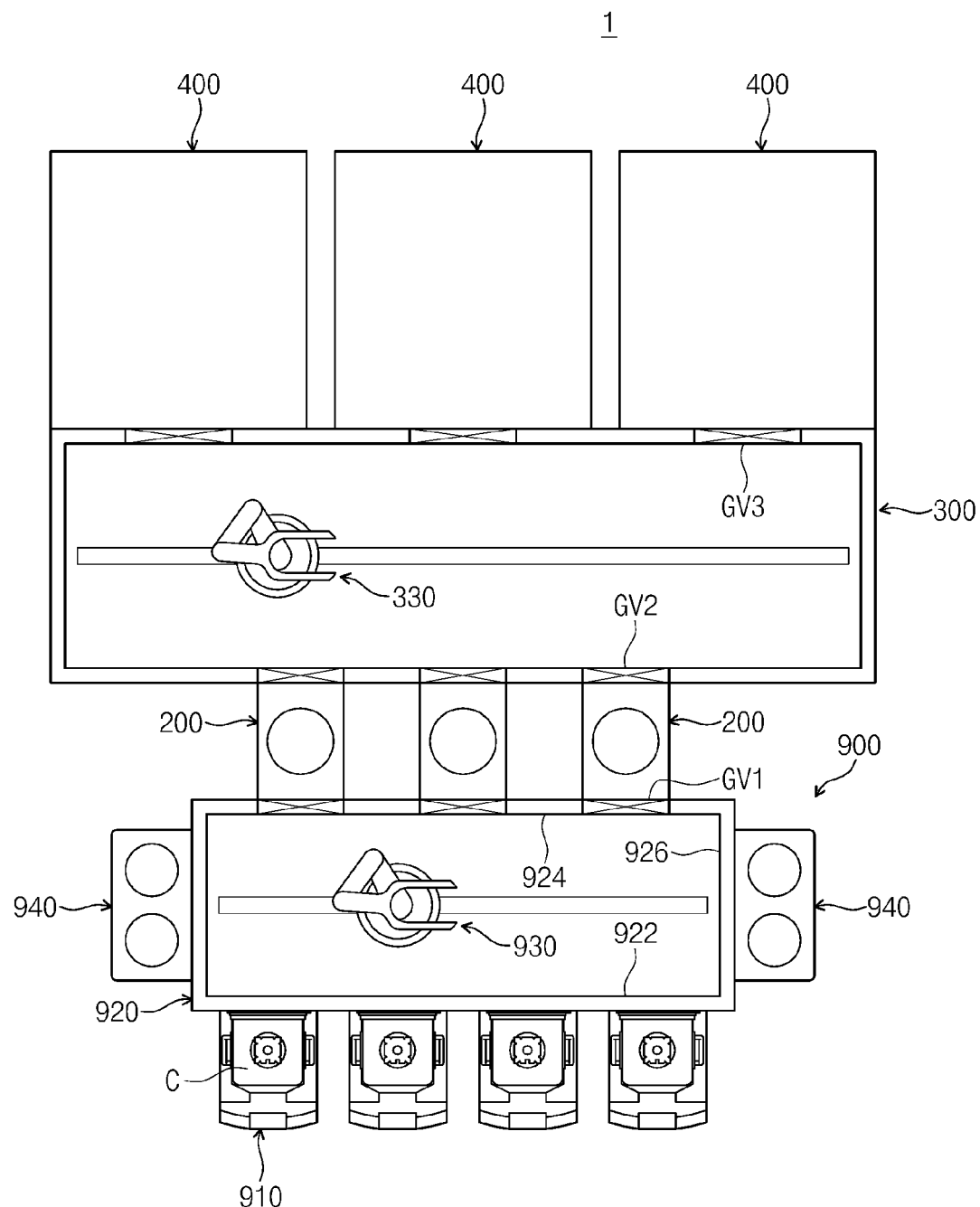
FIG. 1 is a plan view of cluster equipment for selective epitaxial growth according to an embodiment of the present invention.
Figure 2:
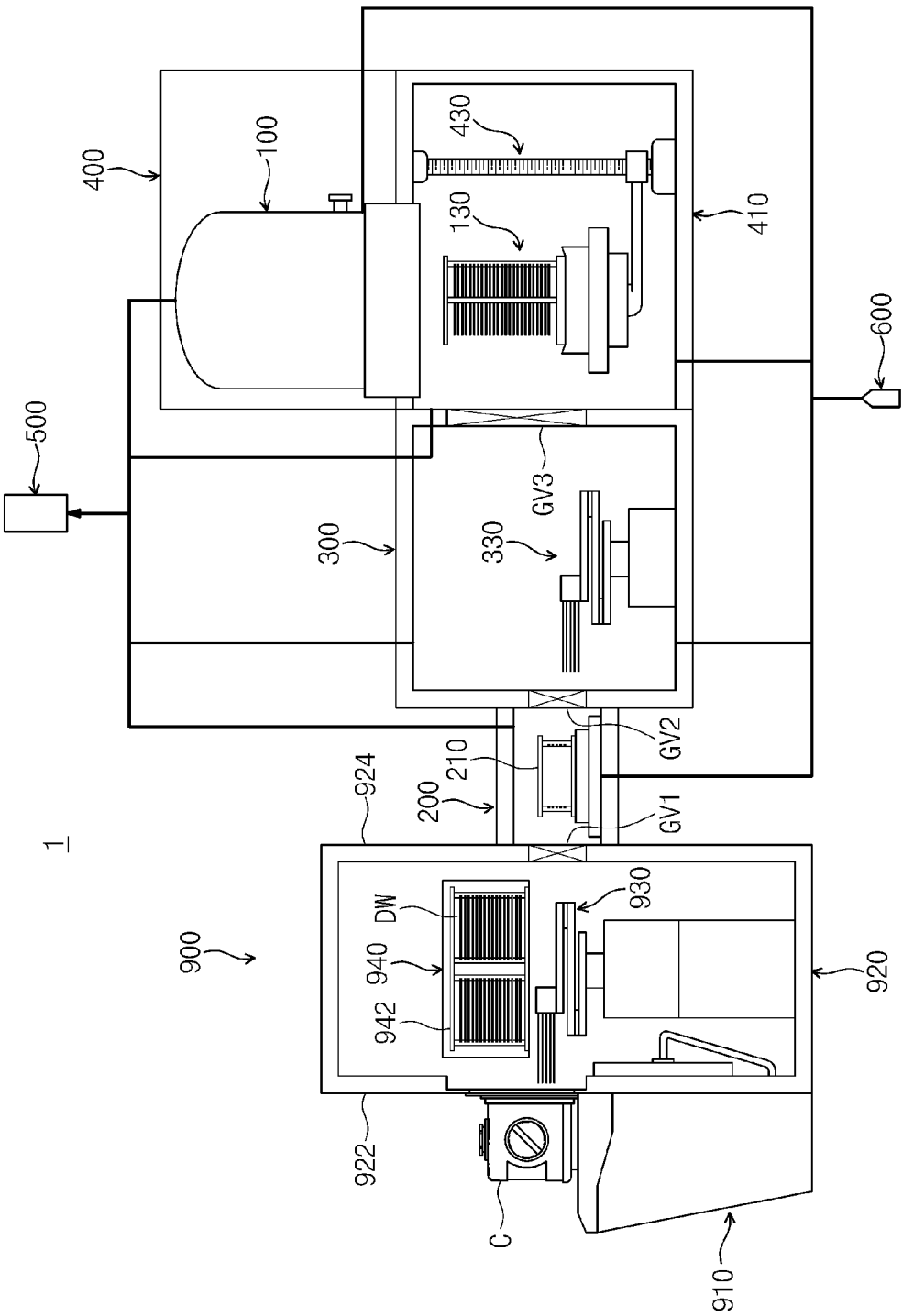
FIG. 2 is a side view of the cluster equipment for treating a substrate according to an embodiment of the present invention.

FIGS. 1 and 2 are a plan view and side view of cluster equipment for selective epitaxial growth according to an embodiment of the present invention.

Referring to FIGS. 1 and 2, cluster equipment 1 for a selective epitaxial growth process includes an equipment front end module (EFEM) 900, first loadlock chambers 200, a transfer chamber 300, and process treatment modules 400.

The EFEM 900 is disposed on a front surface of the cluster equipment 1. The EFEM 900 includes load ports 910 through which cassettes C are loaded and unloaded and an index chamber 920 in which a substrate transfer robot 930 taking the substrate out of each of the cassettes C is disposed to interface so that the substrate is transferred between the cassette C and the first loadlock chamber 200. Here, an atmosphere (ATM) robot is used as the substrate transfer robot 930.

The index chamber 920 is disposed between the load ports 910 and the first loadlock chambers 200. The index chamber 920 has a rectangular parallelepiped shape including a front panel 922, a rear panel 924, and both side panels 926. The substrate transfer robot 930 for transferring the substrate is disposed in the index chamber 920. Although not shown, the index chamber 920 may include a controlled air flow system such as vents and laminar flow system so as to prevent particle contaminants from being introduced into an inner space thereof.

A passage through which a wafer is transferred between the index chamber 920 and the loadlock chamber 200 is defined in the rear panel 924 of the index chamber 920, which is in contact with the loadlock chamber 200. Here, the passage is opened and closed by using a gate valve GV1.

The load ports 910 are disposed in a line on the front panel 922 of the index chamber 920. The cassette C is loaded in and unloaded from the load port 910. The cassette C may be a front open unified pod (FOUP) including a front opened body and a door for opening and closing the front of the body.

Dummy substrate storage units 940 are disposed on both side panels 926 of the index chamber 920. Each of the dummy substrate storage units 940 includes dummy substrate storage containers 942 in which dummy substrates DWs are stacked and stored. The dummy substrates DWs stored in each of the dummy substrate storage containers 942 of the dummy substrate storage unit 940 are used when substrates are lack in the process treatment module 400.

Although not shown, the dummy substrate storage container 942 may be disposed in other chamber instead of the side surface of the index chamber 920. For example, the dummy substrate storage container 942 may be disposed in the transfer chamber 300.

The first loadlock chamber 200 is connected to the EFEM 900 through the gate valve GV1. The first loadlock chamber 200 is disposed between the EFEM 900 and the transfer chamber 300. Three first loadlock chambers 200 are disposed between the EFEM 900 and the transfer chamber 300. Each of the first loadlock chambers 200 may have an inner space that is selectively converted into an atmospheric state or a vacuum state. A stack container 210 in which the substrates are stacked is disposed in the first loadlock chamber 200.

The transfer chamber 300 is connected to the first loadlock chambers 200 through gate valves GV2. The transfer chamber 300 is disposed between the first loadlock chamber 200 and the process treatment module 400. The transfer chamber 300 has a rectangular parallelepiped shape. The substrate transfer robot 330 for transferring the substrate is disposed in the transfer chamber 300. The substrate transfer robot 330 transfers the substrates between the first loadlock chambers 200 and substrate stack units 130 disposed in the second loadlock chambers 410 of the process modules 400. The substrate transfer robot 330 may include an end-effecter by which one or five sheets of substrates are carried. Here, a vacuum robot that is capable of transferring the substrate in a vacuum state is used as the substrate transfer robot 330.

The plurality of process treatment modules 400 may be connected to the transfer chamber 300 through gave valves GV3. For example, three process treatment modules 400, which are selective epitaxial growth devices, may be connected to the transfer chamber 300. The number of process treatment modules 400 may be variously changed.

Referring to FIG. 2, the cluster equipment 1 includes a vacuum exhaust part 500 and an inert gas supply part 600. The vacuum exhaust part 500 includes a vacuum line 510 connected to each of the first loadlock chamber 200, the transfer chamber 300, the second loadlock chamber 410, and the process chamber 100 to provide a vacuum pressure into each of the chambers. The inert gas supply part 600 includes a gas supply line 610 supplying an inert gas into each of the chamber so as to generate pressure differences between the first loadlock chamber 200, the transfer chamber 300, the second loadlock chamber 410, and the process chamber 100.

Also, the index chamber 110 is connected to the first loadlock chamber 200 through the gate valve GV1, the first loadlock chamber is connected to the transfer chamber 300 through each of the gate valves GV2, and the transfer chamber 300 is connected to the second loadlock chamber 410 through each of the gate valves GV3. Thus, each of the chambers may be independently controlled in pressure.

Figure 3:
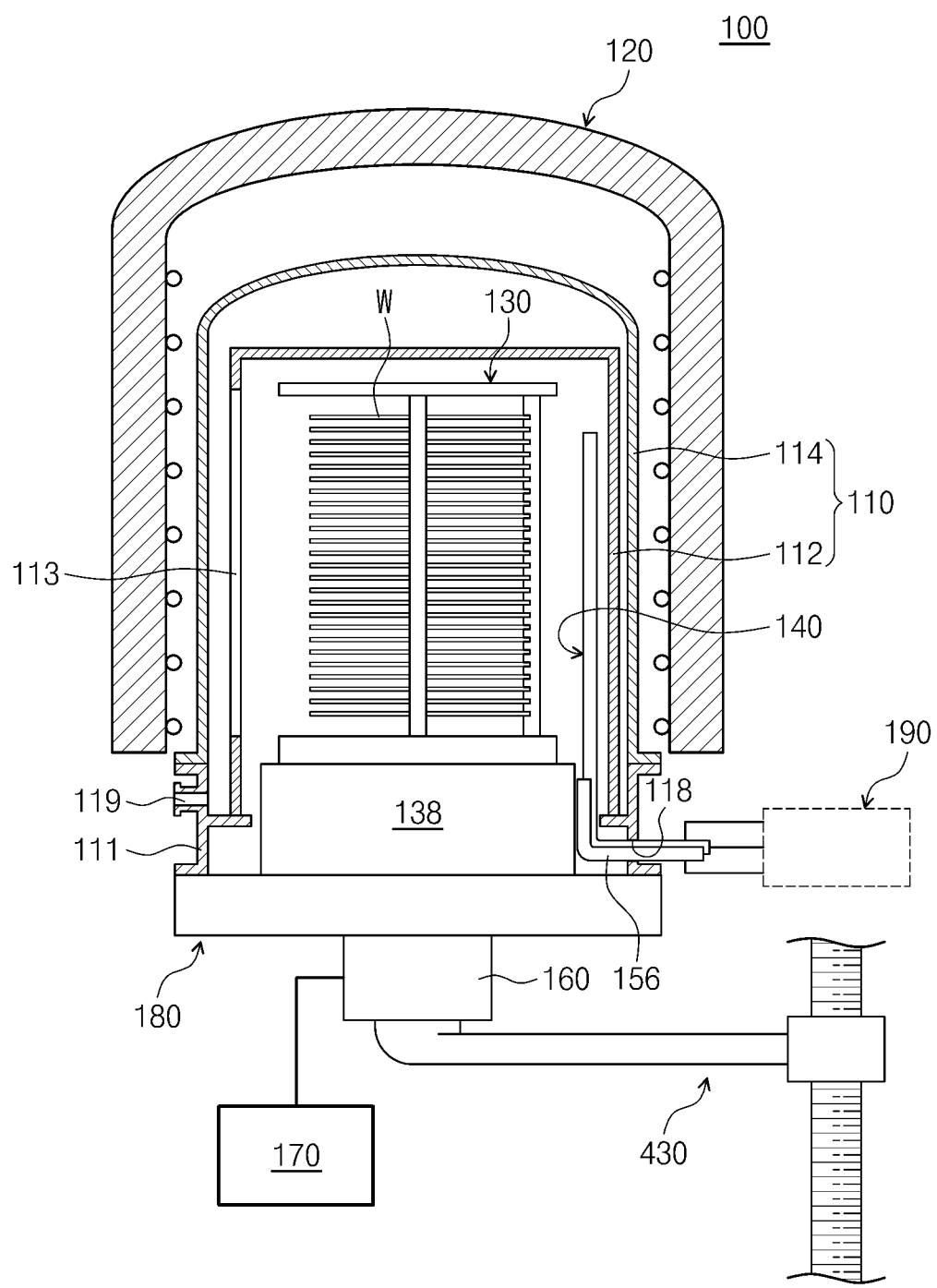
FIG. 3 is a view of a process chamber.

FIG. 3 is a view of a process chamber.

Referring to FIGS. 1 to 3, the process treatment module 400, which is a selective epitaxial growth device, includes the second loadlock chamber 410 and the process chamber 100.

The second loadlock chamber 410 is connected to the transfer chamber 300 through the gate valve GV3. An elevation member 430 for loading/unloading the substrate stack unit 130 in which the substrates are stacked in a batch type in/from an inner space of a process tube 110 of the process chamber 100 is disposed in the second loadlock chamber 410. For example, the substrate stack unit 130 may include a boat having slots so that twenty five or fifty sheets of substrates are stacked. The process chamber 100 is disposed on the second loadlock chamber 410.

The process chamber 100 may include a device for selective epitaxial growth (SEG). For example, the process chamber includes the process tube 110, a heater assembly 120, the substrate stack unit 130, the side nozzle unit 140, a boat rotation unit 160, a control unit 170, and a supply unit 190.

The process tube 110 includes an inner tube 112 in which the substrate stack unit 130 is accommodated and an outer tube 114 surrounding the inner tube 112. The process tube 110 has an inner space in which the substrate stack unit 130 on which the substrates are stacked is loaded to perform a selective epitaxial growth process on the substrates. The process tube 110 may be formed of a material that is capable of withstanding a high temperature, e.g., quartz. Each of the inner and outer tubes 112 and 114 has a cylindrical shape having a blocked upper portion. Particularly, the cutoff part 113 is defined in one side of the inner tube 112 along a length direction (a vertical direction). The cutoff part 113 has a slot shape. The cutoff part 113 and a first side nozzle 142 are arranged in a straight line.

Figure 6:
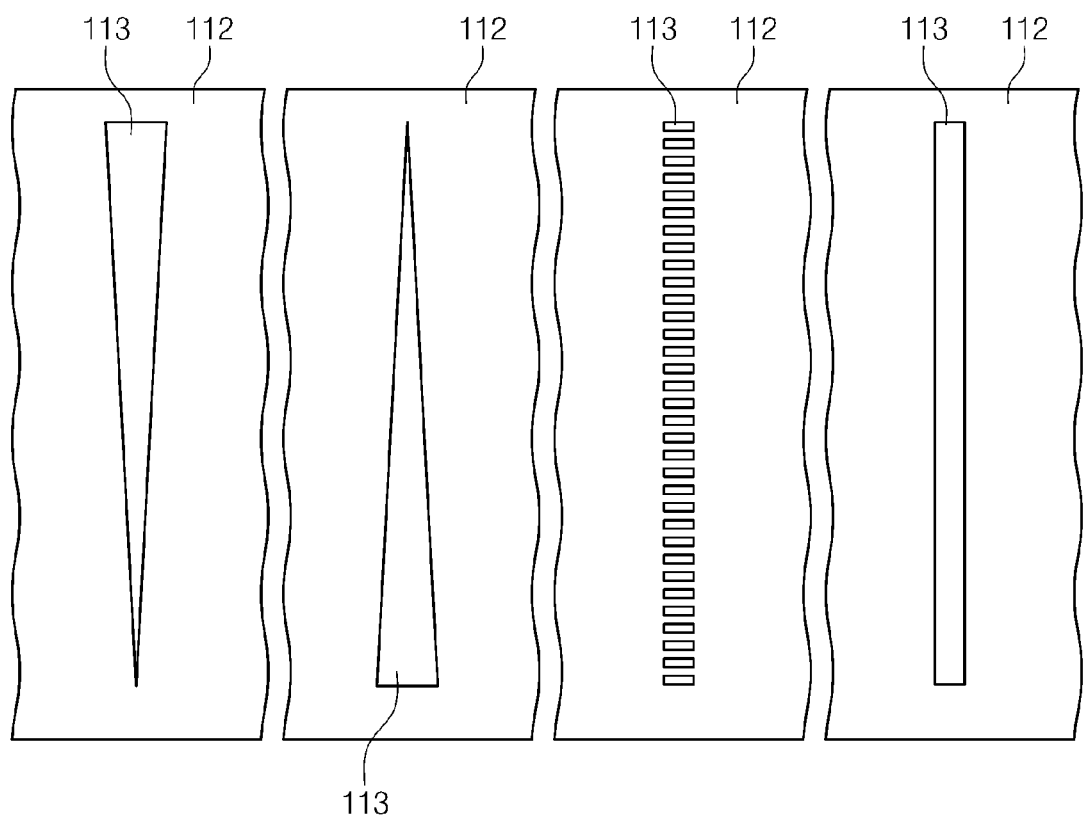
FIG. 6 is a view illustrating various examples of a cutoff part.

FIG. 6 is a view illustrating various examples of a cutoff part.

As illustrated in FIG. 6, the cutoff part 113 has a vertically asymmetric shape such as an inverted angle shape of which a width gradually increases from a lower end thereof toward an upper end thereof and a triangle shape of which a width gradually decreases from a lower end thereof toward an upper end thereof, as illustrated in the first and second drawings from the left in FIG. 6. Also, the cutoff part 113 may have an individual hole shape that is facing an injection hole of the first side nozzle 142 as illustrated in the third drawing from the left in FIG. 6. Also, the cutoff part 113 may have a uniform width as illustrated in the first drawing from the right side in FIG. 6.

Referring again to FIGS. 1 to 3, in the process tube 110, an exhaust port 119 for forcibly suctioning and exhausting inner air in the process tube 110 to decompress the inside of the process tube 110 at one side of the flange 111 and a nozzle port 118 for mounting a side nozzle unit 140 injecting the process gas into the process tube 110 is disposed at an opposite side of the exhaust port 119. The exhaust port 119 may exhaust air in the process tube 110 to the outside during the process. A vacuum exhaust device (not shown) is connected to the exhaust port 119 to exhaust a process gas supplied into the process tube 110 through the exhaust port 119, thereby decompressing the inner pressure of the process tube 110. The heater assembly 120 is disposed to surround the process tube 110.

The substrate stack unit 130 may have slots into which the plurality of substrates (e.g., fifty sheets of substrates) are inserted. The substrate stack unit 130 is mounted on a seal cap 180. The seal cap 180 is loaded into the process tube 110 or unloaded from the process tube 110 by the elevation member 430 which is an elevation device. When the substrate stack unit 130 is loaded in the process tube 110, the seal cap 180 is coupled to a flange 111 of the process tube 110. A sealing member such as an O-ring is provided at a portion in which the flange 111 of the process tube 110 is in contact with the seal cap 180 to prevent the process gas from being leaked between the process tube 110 and the seal cap 180.

The boat rotation unit 160 provides a rotation force for rotating the substrate stack unit 130. A motor may be used as the boat rotation unit 160. The boat rotation unit 160 is disposed on the seal cap 180. The boat rotation unit 160 may include a sensor for detecting a rotation rate of the substrate stack unit 130. The rotation rate of the substrate stack unit 130 detected by the sensor may be provided to the control unit 170.

The control unit 170 controls an operation of the boat rotation unit 160. The control unit 170 controls a rotation rate of the boat rotation unit 160 according to a time for each supply stage of the gas supplied through nozzles of the side nozzle unit 140.

Figure 4:
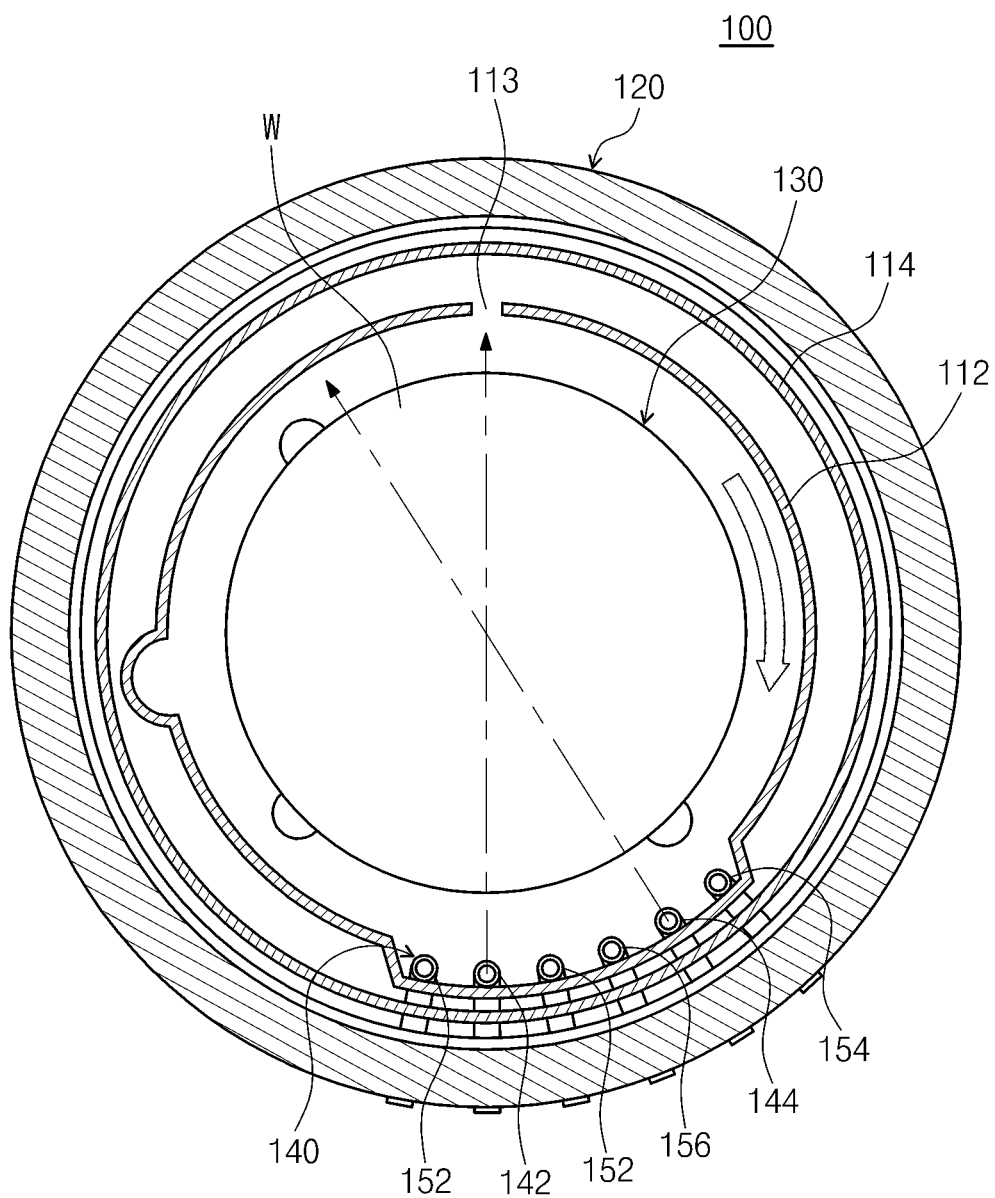
FIG. 4 is a horizontal cross-sectional view of a process tube for explaining a side nozzle unit.
Figure 5:
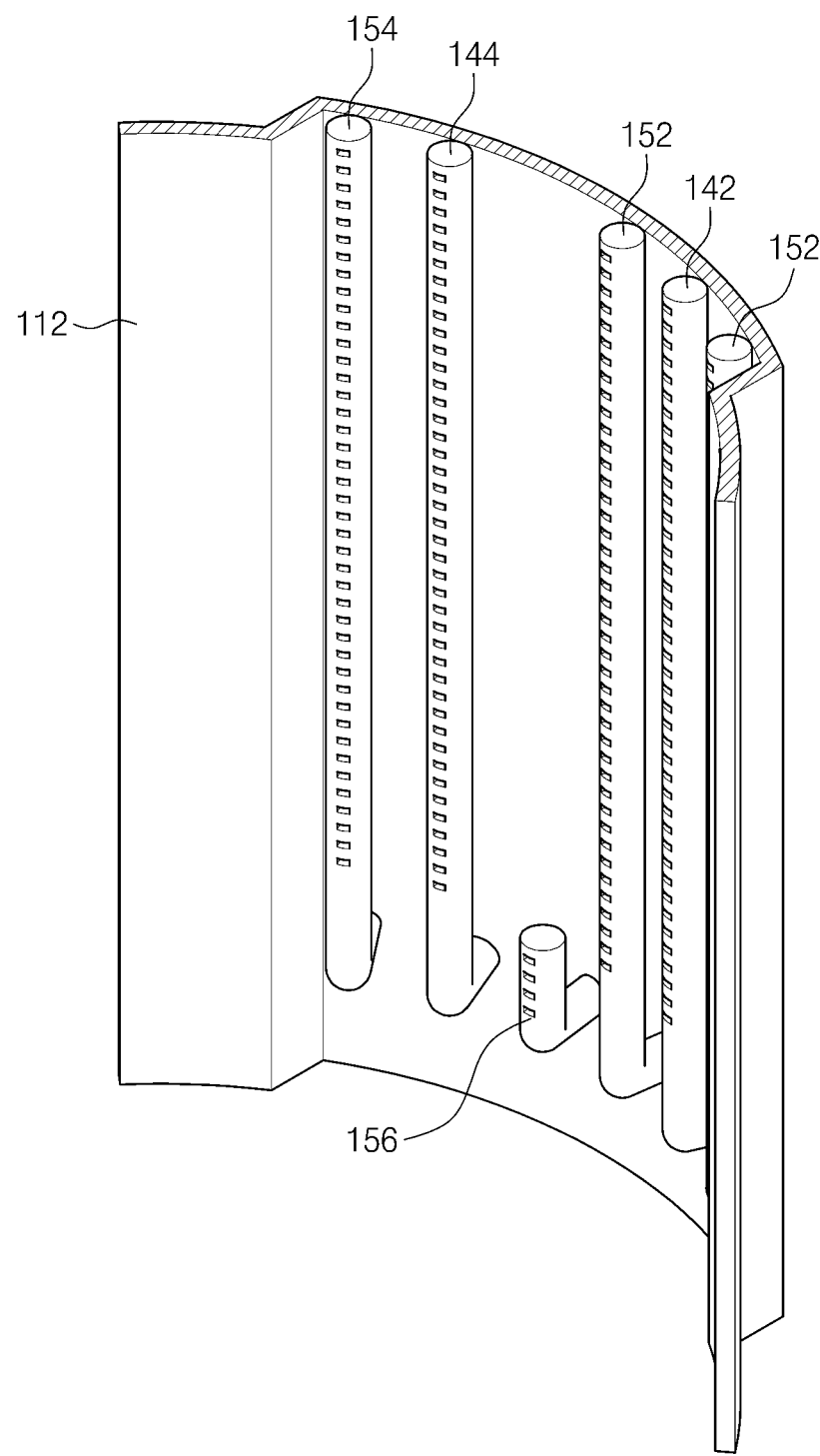
FIG. 5 is a perspective view of the side nozzle unit.

FIG. 4 is a horizontal cross-sectional view of a process tube for explaining a side nozzle unit, and FIG. 5 is a perspective view of the side nozzle unit.

Referring to FIGS. 3 to 5, the side nozzle unit 140 is vertically disposed inside the process tube 110. The side nozzle part may include a plurality of nozzles for supplying gases contributing to the selective epitaxial growth on a surface of the substrate through the process tube 110. For example, the side nozzle unit 140 includes the first side nozzle 142, a second side nozzle 144, and a pair of side curtain nozzles 152, a pre-depo nozzle 154, and a lower cleaning nozzle 156.

The side nozzle unit 140 receives the gases contributing to the selective epitaxial growth on the surface of the substrate through the supply unit 190. The supply unit 190 may selectively supply a depo gas, an etching gas, a cleaning gas, and an inert gas (a purge gas) into the side nozzle unit 140. For example, a gas such as a dichlorosilane (DCS) gas, a silane ($SiH_4$) gas, and a disilane ($Si_2H_6$) gas may be used as the depo gas, and a gas such as a chlorine ($Cl_2$) gas and a hydrochloric acid (HCl) gas may be used as the etching gas. Also, in order to dope impurities, a doping gas such as a diborane ($B_2H_6$) gas and a phosphine ($PH_3$) gas may be used.

The first side nozzle 142 is a nozzle for spraying an etching gas for selective epitaxial growth. The first side nozzle 142 and cutoff part 113 defined in the inner tube 112 are arranged in a straight line to face each other. The pair of side curtain nozzles 152 are disposed in parallel to each other with the first side nozzle 142 therebetween. The side curtain nozzles 152 may spray the inert gases so that the etching gas sprayed from the first side nozzle 142 is straightly sprayed toward the cutoff part 113 of the inner tube 112. For example, the inert gas may include a nitrogen ($N_2$) gas, an argon (Ar) gas, and a hydrogen ($H_2$) gas.

Figure 7:
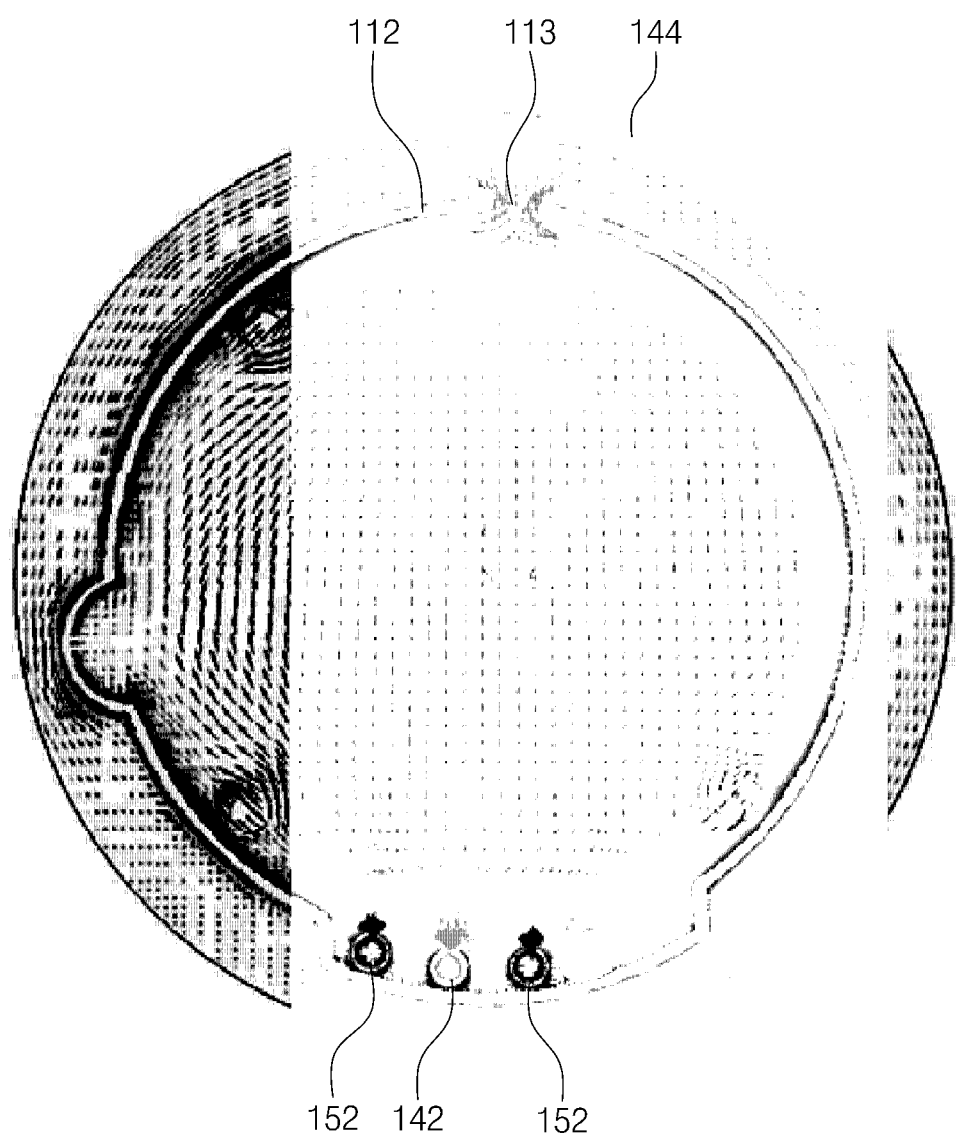
FIG. 7 is simulation illustrating a laminar flow on the substrate.

FIG. 7 is simulation illustrating a laminar flow on the substrate. Other nozzles except for the first side nozzle and the side curtain nozzles are omitted in the results of the simulation of FIG. 7.

Referring to FIG. 7, in the present invention, the etching gas sprayed from the first side nozzle 142 increases in straightness by the inert gases sprayed from the side curtain nozzles 152 to horizontally form a laminar flow on the substrate, thereby improving uniformity of the substrate.

The second side nozzle 144 is a nozzle for spraying a depo gas for selective epitaxial growth and is disposed at one side of the side curtain nozzles 152. The second side nozzle 144 may be obliquely disposed with respect to the exhaust port 119 by a predetermined angle.

The pre-depo nozzle 154 sprays the depo gas for precoating of the inside of the process tube 110 after an in-situ cleaning process to make an inner environment of the process tube 110 into a condition in which a film is capable of being formed on the substrate. Of course, although the precoating may be performed by using the second side nozzle 144, the pre-depo nozzle 154 may be separately installed to reduce frequency of use of the second side nozzle 144, thereby reducing lifespan of the second side nozzle 144 and formation of the thin film in the nozzle. Thus, an in-situ cleaning period may be extended.

The lower cleaning nozzle 156 cleans a lower end of the inner tube 112 when the in-situ cleaning process is performed. As illustrated in FIGS. 3 and 5, the lower cleaning nozzle 156 has a short length when compared to other nozzles. The lower cleaning nozzle 156 sprays a gas for cleaning (e.g., a chlorine trifluoride ($ClF_3$) and fluorine ($F_2$) gas) around a boat support 138 between the substrate stack unit 130 and the seal cap 180. For reference, when the in-situ cleaning process is performed, the gas for cleaning is sprayed from the second side nozzle 144 and also from the lower cleaning nozzle 156. Here, the gas for cleaning sprayed from the lower cleaning nozzle 156 is sprayed around the boat support 138 where is out of a range in which the gas for cleaning is sprayed from the second side nozzle 144. The lower cleaning nozzle 156 may reduce the time of in-situ cleaning.

A selective epitaxial growth method conducted by using the above-described process chamber 100 will be simply described as follows.

First, when the plurality of substrates are stacked on the substrate stack unit 130, the substrate stack unit 130 is loaded into the process tube 110 by an elevation operation of the elevation device 430. Here, a lower end of the process tube 110 is sealed by the seal cap 180. Then, the vacuum exhaust device (not shown) is feedback controlled so that the process tube 110 has a desired inner pressure (a vacuum degree). Also, the inside of the process tube 110 is heated by the heater assembly 120 so that the process tube 110 has a desired inner temperature that is suitable for the selective epitaxial growth. When the inside of the process tube 110 is heated by the heater assembly 120, an electrically conductive state with respect to the heater assembly 120 is feedback controlled on the basis of temperature information detected by a temperature sensor so that the process tube 110 has a desired inner temperature distribution. Then, the substrate stack unit 130 rotates by the boat rotation unit 160 to rotate the substrates.

Each of nozzles of the side nozzle unit 140 receives the process gases such as the depo gas, the etching gas, and the inert gas through the supply part during a predetermined time to spray the process gases. The gases sprayed to the inner tube 112 pass through the substrates and then are exhausted to the cutoff part 113 of the inner tube.

Meanwhile, each of nozzles of the side nozzle part may spray gas in various processes as follows: First, a process of simultaneously supplying the depo gas and the etching gas. Second, a process of forming the thin film on the substrate by simultaneously supplying the depo gas and the etching gas onto the substrate (e.g., for about 20 min)→a process of supplying only the etching gas to additionally remove the impurities (for about 3 min) and then supplying the depo gas again for a predetermined time (for about 15 min)→a process of repeatedly performing the process of supplying only the etching gas to remove the impurities. Third, a process of supplying only the depo gas (for about 40 sec)→a process of supplying a purge gas for removing residual substances (for about 30 sec)→a process of supplying the etching gas (for about 15 sec)→a process of repeatedly performing the process of supplying the purge gas for removing the residual substances (for about 40 sec). Through these processes, a selective epitaxial film having high quality may be formed on the substrate.

Meanwhile, the purge gas may be supplied together with the depo and etching gases at the same time for each of the processes for growing an epitaxial layer on the substrate or may be supplied before or after the depo or etching gas is supplied. Alternatively, the purge gas may be supplied before the depo or etching gas is supplied and then be continuously supplied while the depo or etching gas is supplied.

As described above, according to the process chamber 100 according to an embodiment of the present invention, the side nozzle unit 140 may be vertically disposed in the inner tube to horizontally supply the process gas, and particularly, the side curtain nozzles 152 may be disposed at left/right sides of the first side nozzle 142 to improve straightness of the etching gas, thereby improving a gas flow on the substrate. Thus, a film formed on the substrate may be improved in quality.

Figure 8:
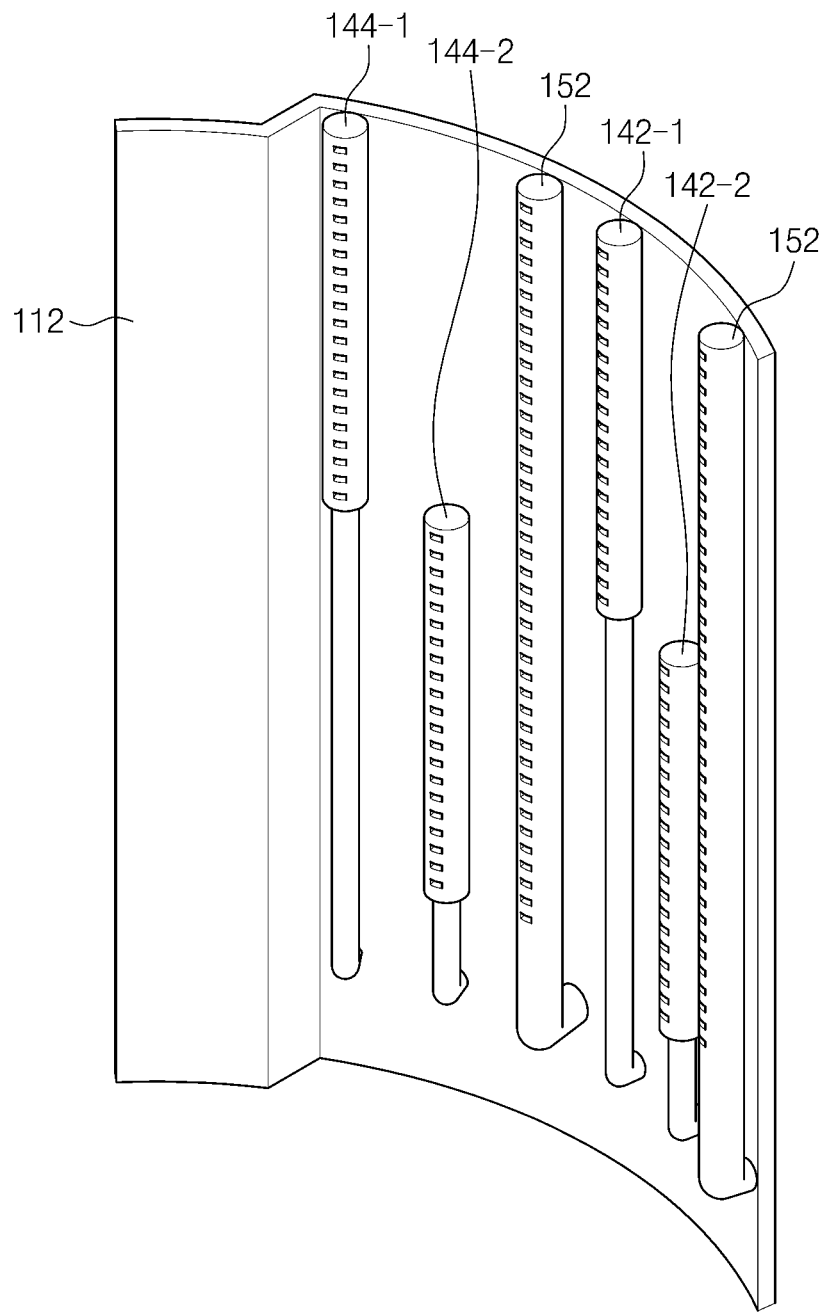
FIG. 8 is a perspective view illustrating another example of the side nozzle unit.
Figure 9:
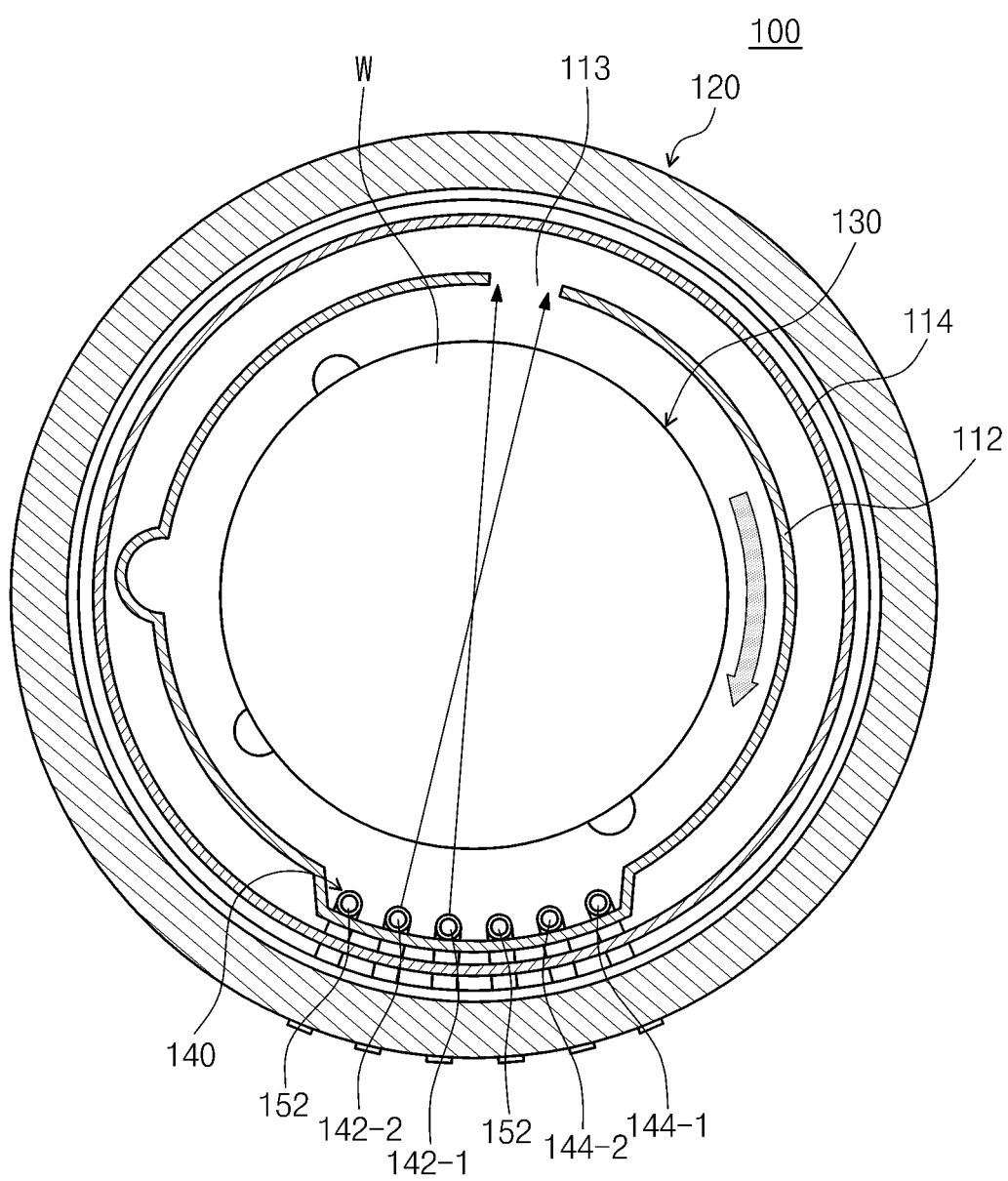
FIG. 9 is a horizontal cross-sectional view of a process tube to which the side nozzle unit is applied illustrated in FIG. 8.

FIG. 8 is a perspective view illustrating another example of the side nozzle unit, and FIG. 9 is a horizontal cross-sectional view of a process tube to which the side nozzle unit is applied illustrated in FIG. 8.

Referring to FIGS. 8 and 9, the first side nozzle 142 may include section nozzles spraying gases for each of a plurality of sections in a longitudinal direction of the substrate stack unit 130. For example, the first side nozzle 142 includes first and second section nozzles 142-1 and 142-2 respectively spraying the gases into two sections. The first section nozzle 142-1 sprays the gas into an upper section of the substrate stack unit 130, and the second section nozzle 142-2 sprays the gas into a lower section of the substrate stack unit 130. The first and second section nozzles 142-1 and 142-2 are disposed adjacent to each other. The first and second section nozzles 142-1 and 142-2 and the cutoff part 113 defined in the inner tube 112 are arranged in a straight line to face each other.

The second side nozzle 144 may include section nozzles spraying gases with respect to a length direction of the substrate stack unit 130 for each of a plurality of sections. For example, the second side nozzle 144 includes first and second section nozzles 144-1 and 144-2. The first section nozzle 144-1 sprays the gas into the upper section of the substrate stack unit 130, and the second section nozzle 144-2 sprays the gas into the lower section of the substrate stack unit 130.

Since each of the first section nozzles 142-1 and 144-1 has a length different from that of each of the second section nozzles 142-2 and 144-2, when the gas is sprayed, a gas staying time (a gas retention time) within the first section nozzles 142-1 and 144-1 is different from that within each of the second section nozzles 142-2 and 144-2. For example, the gas may be sprayed from the second section nozzle 142-2 that is faster than the gas sprayed from the first section nozzle 142-1. Thus, the substrates disposed in the substrate stack unit 130 may have thicknesses different from those of the substrates disposed under the substrate stack unit 130.

Figure 10:
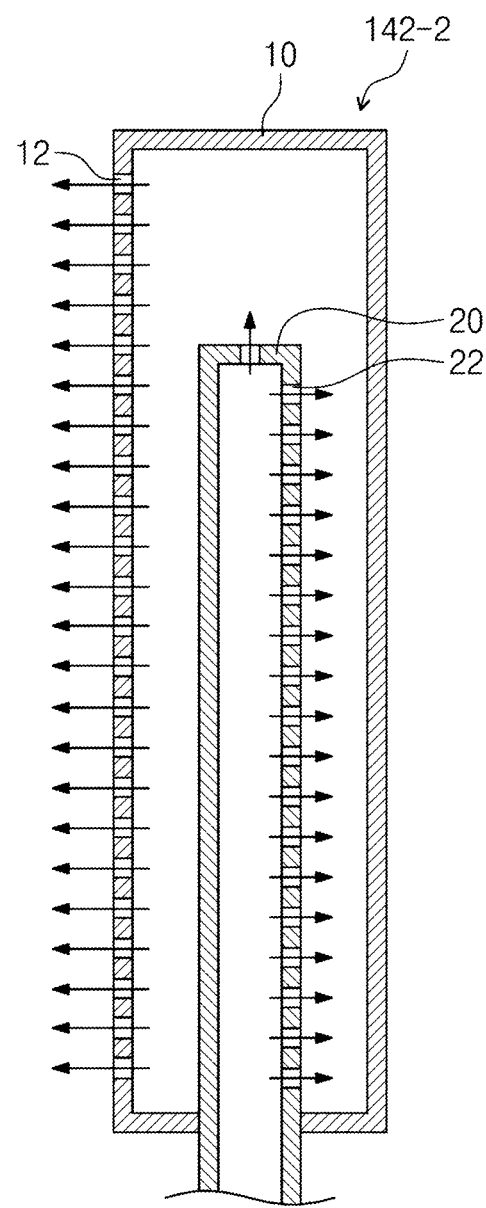
FIGS. 10 and 11 are views illustrating the inside of a section nozzle illustrated in FIG. 8.
Figure 11:
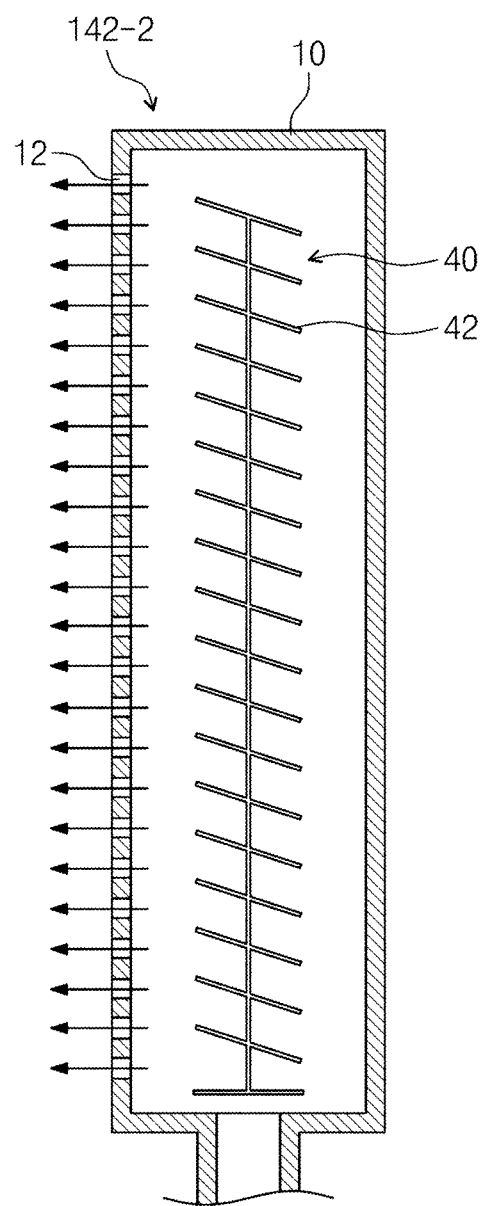

FIGS. 10 and 11 are views illustrating the inside of a section nozzle illustrated in FIG. 8.

Referring to FIG. 10, according to an embodiment, the second section nozzle 142-2 may have a double-tube structure so that the gas staying time (the gas retention time) within the second section nozzle 142-2 is the same as that within the first section nozzle 142-1. That is, the second section nozzle 142-2 includes an outer tube 10 and an inner tube 20, and spray holes 12 and 22 are defined in each of the outer and inner tubes 10 and 20. Here, the spray holes 22 of the inner tube and the spray holes 12 of the outer tube may have spray directions different from each other. Thus, the gas staying time within the second section nozzle 142-2 may be extended.

Referring to FIG. 11, according to another embodiment, a confinement structure 40 for restraining a gas flow is disposed in the second section nozzle 142-2 so that the gas staying time (the gas retention time) within the second section nozzle 142-2 is the same as that within the first section nozzle 142-1. The confinement structure 40 may include a plurality of blocking plates 42. Since the gas flow is slowed due to the blocking plates 42, the gas staying time (the gas retention time) within the second section nozzle 142-2 may be extended.

The side nozzle unit having the above-described section nozzles may be applied to a thermal treatment device for other deposition processes as well as the epitaxial growth process.

If a person of ordinary skill in the art to which this invention pertains without departing from the essential characteristics of the present invention in the range described above, is only the spirit of the present invention have been described for illustrative purposes, various modifications, additions and substitutions are possible. Therefore, to explain the embodiments disclosed in the present disclosure is not limited to the technical idea of the present disclosure, and are not limited by this embodiment without departing from the scope or spirit of the invention. The scope of protection of the present disclosure, all the technical idea, within the scope of its equivalent shall be construed by the following claims should be construed as being included in the scope of the present disclosure.

The invention claimed is:

1. Cluster equipment for treating a substrate, the cluster equipment comprising:
    an equipment front end module (EFEM) comprising load ports where cassettes in which substrates are stacked are placed;
    a first loadlock chamber connected to the EFEM through a gate valve and having an inner space that is selectively converted into an atmospheric or vacuum pressure;
    a transfer chamber in which a carrying device for carrying the substrate is disposed, the transfer chamber being connected to the first loadlock chamber through a gate valve;
    second loadlock chambers in which substrate stack units in which substrates are stacked in a batch type are disposed, the second loadlock chambers each of which is connected to the transfer chamber through a gate valve; and
    process chambers each of which is disposed on each of the second loadlock chambers, the process chambers for process-treating the substrates stacked on a substrate stack unit,
    wherein each process chamber comprises:
        a process tube comprising an inner tube in which the substrate stack unit is accommodated and an outer tube surrounding the inner tube; and
        a side nozzle unit vertically disposed inside the process tube,
        wherein the side nozzle unit comprises:
            a first side nozzle configured to spray a first gas;
            a second side nozzle configured to spray a second gas; and
            side curtain nozzles disposed in parallel to each other and configured to spray an inert gas in a direction different from each other, and
        wherein the first side nozzle is positioned between the side curtain nozzles which, when spraying the inert gas, improve straightness of the first gas sprayed from the first side nozzle.

2. The cluster equipment according to claim 1, wherein the process chamber further comprises:
    a rotation unit rotating the substrate stack unit; and
    a heater assembly disposed to surround the process tube.

3. The cluster equipment according to claim 1, further comprising:
    a pre-deposition nozzle vertically disposed inside the process tube to perform pre-coating on the inside of the inner tube; and a lower cleaning nozzle for cleaning a lower end of the inner tube when the inside of the inner tube is cleaned.

4. The cluster equipment according to claim 1, wherein the inner tube further comprises a cutoff part facing the first side nozzle across an inner space of the inner tube.

5. The cluster equipment according to claim 1, wherein each of the transfer chamber, the second loadlock chamber, and the process chamber are maintained in a vacuum state.

6. The cluster equipment according to claim 5, further comprising a vacuum exhaust unit connected to each of the transfer chamber, the second loadlock chamber, and the process chamber.

7. The cluster equipment according to claim 1, wherein the EFEM further comprises:
   an index chamber in which a carrying device disposed between the load ports and the first loadlock chamber to carry the substrate between the cassette disposed on the load port and the first loadlock chamber is disposed; and
   a dummy substrate storage module disposed on a side surface of the index chamber to store dummy substrates.

8. The cluster equipment according to claim 1, further comprising a dummy substrate storage module in which dummy substrates are stored in the transfer chamber.

9. The cluster equipment according to claim 7, wherein the index chamber is connected to the first loadlock chamber through a gate valve, the first loadlock chamber is connected to the transfer chamber through a gate valve, and the transfer chamber is connected to the second loadlock chamber through a valve to independently control a pressure within each of the chambers.

10. The cluster equipment according to claim 7, further comprising a vacuum exhaust unit connected to each of the first loadlock chamber, the transfer chamber, and the second loadlock chamber; and
   an inert gas supply unit for supplying an inert gas into each of the chambers to generate a pressure difference between the first loadlock chamber, the transfer chamber, the second loadlock chamber, and the process chamber.

11. The cluster equipment according to claim 7, further comprising a pressure differential generation member for preventing cross-contamination between the transfer chamber, the second loadlock chamber, and the process chamber from occurring.

12. The cluster equipment according to claim 11, wherein the pressure differential generation member comprises an inert gas supply unit for supplying an inert gas into each of the transfer chamber, the second loadlock chamber, and the process chamber.

* * * * *